(12) United States Patent
Bae et al.

(10) Patent No.: US 9,318,478 B1
(45) Date of Patent: Apr. 19, 2016

(54) SEMICONDUCTOR DEVICE AND FABRICATING METHOD THEREOF

(71) Applicant: SAMSUNG ELECTRONICS CO., LTD., Suwon-Si, Gyeonggi-Do (KR)

(72) Inventors: Deok-Han Bae, Anyang-Si (KR); Dong-Kwon Kim, Gimcheon-Si (KR); Jong-Hyuk Kim, Seoul (KR); Yoon-Moon Park, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/610,046

(22) Filed: Jan. 30, 2015

(51) Int. Cl.
*H01L 27/088* (2006.01)
*H01L 27/02* (2006.01)

(52) U.S. Cl.
CPC ........ *H01L 27/0207* (2013.01); *H01L 27/0886* (2013.01)

(58) Field of Classification Search
CPC ............ H01L 27/0207; H01L 27/0886; H01L 29/66545; H01L 21/28123
USPC .......................................................... 257/401
See application file for complete search history.

(56) References Cited

U.S. PATENT DOCUMENTS

| 6,670,684 | B2 * | 12/2003 | Ikeda ................ H01L 27/11524 257/315 |
| 8,252,691 | B2 | 8/2012 | Beynet et al. |
| 8,497,198 | B2 | 7/2013 | Chien et al. |
| 8,507,384 | B2 | 8/2013 | Zhu |
| 8,557,675 | B2 | 10/2013 | LiCausi |
| 8,624,297 | B2 | 1/2014 | Chun et al. |
| 8,673,165 | B2 | 3/2014 | Raghunathan et al. |
| 2013/0244437 | A1 | 9/2013 | Flachowsky et al. |
| 2014/0057436 | A1 | 2/2014 | Chen et al. |

* cited by examiner

*Primary Examiner* — Tu-Tu Ho
(74) *Attorney, Agent, or Firm* — F. Chau & Associates, LLC

(57) ABSTRACT

A semiconductor device includes a first dummy gate having a first width, a second dummy gate adjacent to the first dummy gate in a lengthwise direction and having a second width, and a first bridge connecting the first dummy gate and the second dummy gate to each other. The first width and the second width are smaller than a minimum processing line width.

20 Claims, 25 Drawing Sheets

SEMICONDUCTOR DEVICE AND FABRICATING METHOD THEREOF

TECHNICAL FIELD

Exemplary embodiments of the present inventive concept relate to a semiconductor device and a fabricating method thereof.

DISCUSSION OF THE RELATED ART

In order to increase a pattern density and patternability, dummy patterns may be formed on some regions of a substrate. In this case, however, the dummy patterns may be undercut or asymmetrically formed. Such dummy patterns formed in this manner may become sources of defects during subsequent processes.

SUMMARY

Exemplary embodiments of the present inventive concept provide a semiconductor device including a dummy pattern formed in a reliable manner.

Exemplary embodiments of the present inventive concept further provide a fabricating method of a semiconductor device including a dummy pattern formed in a reliable manner.

According to an exemplary embodiment of the present inventive concept, a semiconductor device includes a first dummy gate having a first width, a second dummy gate adjacent to the first dummy gate in a lengthwise direction and having a second width, and at least one bridge connecting the first dummy gate and the second dummy gate to each other. The first width and the second width are smaller than a minimum processing line width.

According to an exemplary embodiment of the present inventive concept, a semiconductor device includes a first dummy gate having a first width, a second dummy gate adjacent to the first dummy gate in a lengthwise direction and having a second width, at least one bridge connecting the first dummy gate and the second dummy gate to each other, a first gate having a third width, a second gate adjacent to the first gate in a lengthwise direction and having a fourth width, and a third gate having a fifth width greater than the third width and the fourth width. The fifth width is greater than a distance between the first dummy gate and the second dummy gate.

According to an exemplary embodiment of the present inventive concept, a semiconductor device includes a fin, a plurality of dummy gates formed to cross the fin and adjacent to each other in a lengthwise direction, each having a width smaller than a minimum processing line width, and a plurality of bridge pairs formed between each of adjacent dummy gates from among the plurality of dummy gates. The plurality of bridge pairs includes first to seventh bridge pairs, and the second to seventh bridge pairs are arranged and are positioned at vertexes of a hexagonal honeycomb structure, centering around the first bridge pair.

According to an exemplary embodiment of the present inventive concept, a fabricating method of a semiconductor device includes forming a first mask and a second mask shaped as spacers facing each other on a lower layer, forming a third mask shaped of an island connecting a portion of the first mask and a portion of the second mask, forming a rectangular third mask pattern by removing a portion of the third mask, and completing a dummy pattern by patterning the lower layer using the first mask, the second mask and the third mask pattern.

According to an exemplary embodiment of the present inventive concept a semiconductor device includes a first dummy gate having a first width, a second dummy gate adjacent to the first dummy gate in a lengthwise direction and having a second width, and a first bridge connecting the first dummy gate and the second dummy gate to each other. The first width and the second width are smaller than a minimum processing line width.

In an exemplary embodiment, the first dummy gate and the second dummy gate cross a plurality of fins of the semiconductor device.

In an exemplary embodiment, a distance between the first dummy gate and the second dummy gate is greater than the first width and the second width.

In an exemplary embodiment, the semiconductor device further includes a second bridge, a third bridge and a fourth bridge. The first to fourth bridges are sequentially arranged between the first dummy gate and the second dummy gate. A first distance between the first bridge and the second bridge and a second distance between the third bridge and the fourth bridge are substantially equal to each other, and the first distance between the first bridge and the second bridge is smaller than a third distance between the second bridge and the third bridge.

In an exemplary embodiment, the semiconductor device further includes a third dummy gate, a fourth dummy gate, a fifth dummy gate and a sixth dummy gate. The third to sixth dummy gates are adjacent to the first and second dummy gates in the lengthwise direction, and the first to sixth dummy gates are sequentially arranged in an order of the first dummy gate, the second dummy gate, the third dummy gate, the fourth dummy gate, the fifth dummy gate and the sixth dummy gate.

In an exemplary embodiment, the semiconductor device further includes a second bridge connecting the third dummy gate and the fourth dummy gate to each other.

In an exemplary embodiment, the first bridge is formed between the first dummy gate and the second dummy gate, and an area between the third dummy gate and the fourth dummy gate that is in a substantially same line as the first bridge does not include the second bridge or another bridge.

In an exemplary embodiment, there are no bridges formed between the second dummy gate and the third dummy gate.

In an exemplary embodiment, the first bridge is formed between the first dummy gate and the second dummy gate, a third bridge is formed between the fifth dummy gate and the sixth dummy gate, and the first bridge and the third bridge are formed substantially in a same line.

In an exemplary embodiment, the second bridge is not formed in substantially the same line as the first and third bridges.

In an exemplary embodiment, a width of the first bridge is substantially equal to the first width and the second width.

According to an exemplary embodiment of the present inventive concept, a semiconductor device includes a first dummy gate having a first width, a second dummy gate adjacent to the first dummy gate in a lengthwise direction and having a second width, a first bridge connecting the first dummy gate and the second dummy gate to each other, a first gate having a third width, a second gate adjacent to the first gate in the lengthwise direction and having a fourth width, and a third gate having a fifth width greater than the third width and the fourth width. The fifth width is greater than a distance between the first dummy gate and the second dummy gate.

In an exemplary embodiment, the first width, the second width, the third width and the fourth width are smaller than a minimum processing line width.

In an exemplary embodiment, the fifth width is substantially equal to or greater than a minimum processing line width.

In an exemplary embodiment, there are no bridges formed between the first gate and the second gate.

In an exemplary embodiment, the first dummy gate and the second dummy gate cross a first fin of the semiconductor device, and the first gate and the second gate cross a second fin of the semiconductor device.

In an exemplary embodiment, the semiconductor device further includes a second bridge, a third bridge and a fourth bridge formed between the first dummy gate and the second dummy gate and sequentially arranged in an order of the first bridge, the second bridge, the third bridge and the fourth bridge. A first distance between the first bridge and the second bridge and a second distance between the third bridge and the fourth bridge are substantially equal to each other, and the first distance is smaller than a third distance between the second bridge and the third bridge.

In an exemplary embodiment, the semiconductor device further includes a third dummy gate and a fourth dummy gate adjacent to the first dummy gate and the second dummy gate in the lengthwise direction. The first to fourth dummy gates are sequentially arranged in an order of the first dummy gate, the second dummy gate, the third dummy gate and the fourth dummy gate.

In an exemplary embodiment, the first bridge is formed between the first dummy gate and the second dummy gate, and a first area between the third dummy gate and the fourth dummy gate and a second area between the second dummy gate and the third dummy gate that are in a substantially same line as the first bridge do not include another bridge.

In an exemplary embodiment, the first bridge is formed between the first dummy gate and the second dummy gate, and a second bridge is formed between the second dummy gate and the third dummy gate in a substantially same line as the first bridge.

According to an exemplary embodiment of the present inventive concept, a semiconductor device includes a fin and a plurality of dummy gates adjacent to each other in a lengthwise direction. The plurality of dummy gates cross the fin and each of the plurality of dummy gates has a width smaller than a minimum processing line width. The semiconductor device further includes a plurality of bridge pairs formed between each of adjacent dummy gates from among the plurality of dummy gates. The plurality of bridge pairs includes first to seventh bridge pairs, and the second to seventh bridge pairs are positioned at vertexes of a hexagonal honeycomb structure that is centered around the first bridge pair.

In an exemplary embodiment, a distance between the first bridge pair and the second bridge pair and a distance between the first bridge pair and the third bridge pair are substantially equal to each other.

In an exemplary embodiment, the first to third bridge pairs are arranged in a substantially same line.

In an exemplary embodiment, the plurality of dummy gates includes a first dummy gate and a second dummy gate, and at least two bridge pairs from among the plurality of bridge pairs are disposed between the first dummy gate and the second dummy gate.

According to an exemplary embodiment of the present inventive concept, a method of fabricating a semiconductor device includes forming a first mask and a second mask on a lower layer. The first mask and the second mask face each other. The method further includes forming a third mask connecting a portion of the first mask and a portion of the second mask between the first mask and the second mask, and forming a rectangular mask pattern by removing a portion of the third mask. The rectangular mask pattern includes a first rectangular portion disposed on the first mask and a second rectangular portion disposed on the second mask. The method further includes completing a dummy pattern by patterning the lower layer using the first mask, the second mask and the mask pattern.

According to an exemplary embodiment of the present inventive concept, a semiconductor device includes a first dummy gate having a first width, a second dummy gate adjacent to the first dummy gate in a lengthwise direction and having a second width, and a first bridge connecting the first dummy gate and the second dummy gate to each other. A distance between the first dummy gate and the second dummy gate is greater than the first width and the second width.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION OF THE EXEMPLARY EMBODIMENTS

Figure 1:
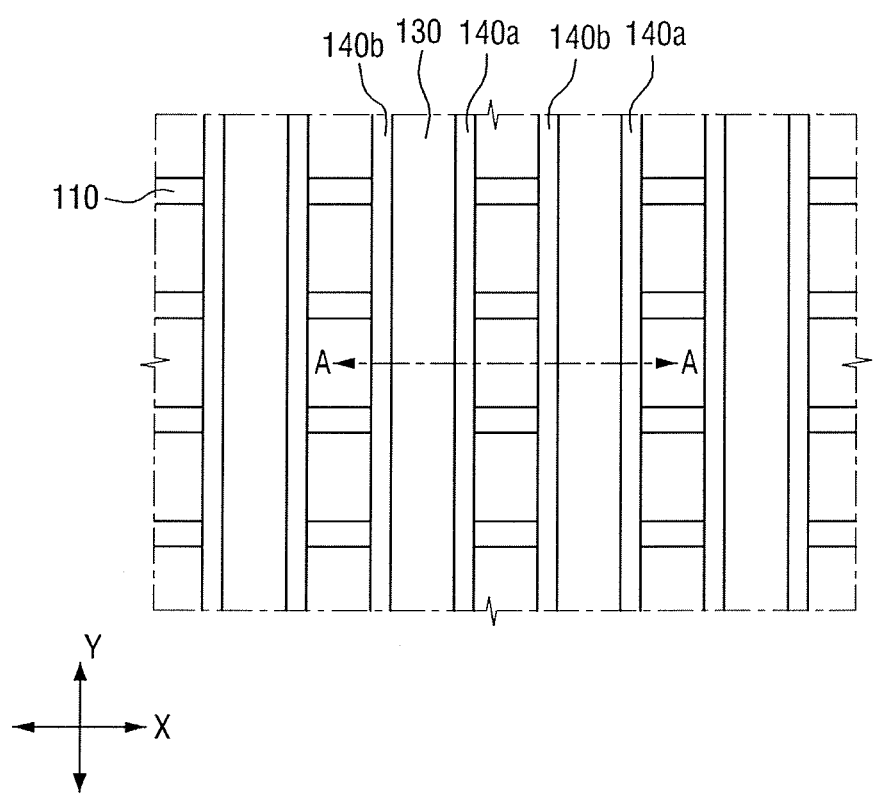
FIGS. 1 to 10 illustrate intermediate process steps illustrating a fabricating method of a semiconductor device according to an exemplary embodiment of the present inventive concept.

Exemplary embodiments of the present inventive concept will be described more fully hereinafter with reference to the accompanying drawings. Like reference numerals may refer to like elements throughout the accompanying drawings. In the drawings, the thickness of layers and regions may be exaggerated for clarity.

It will be understood that when a layer is referred to as being "on" another layer or substrate, it can be directly on the other layer or substrate, or intervening layers may also be present.

Spatially relative terms, such as "beneath," "below," "lower," "above," "upper" etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (e.g., rotated 90 degrees or at other orientations) and the spatially relative descriptors used herein interpreted accordingly.

As used herein, when elements are described as being adjacent to one another, the elements may be directly adjacent to one another or intervening elements may be present.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

Herein, when two or more elements or values are described as being substantially the same as or equal to each other, it is to be understood that the elements or values are identical to each other, indistinguishable from each other, or distinguishable from each other but functionally the same as each other as would be understood by a person having ordinary skill in the art.

Hereinafter, a fabricating method of a semiconductor device according to an exemplary embodiment of the present inventive concept will be described with reference to FIGS. 1 to 11.

Figure 2:
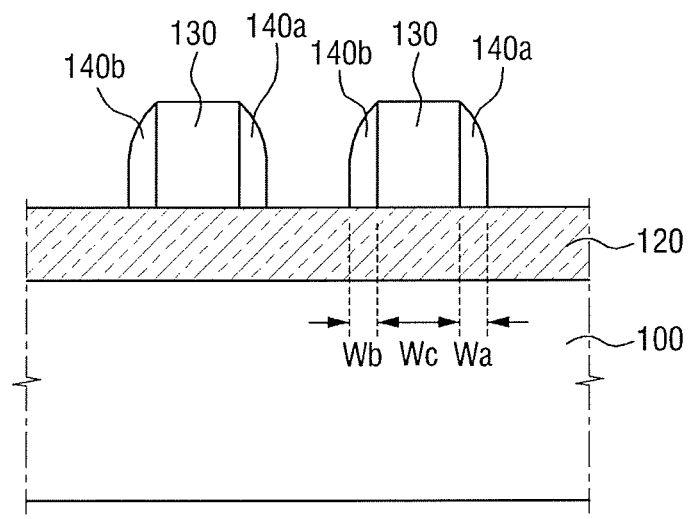
Figure 3:
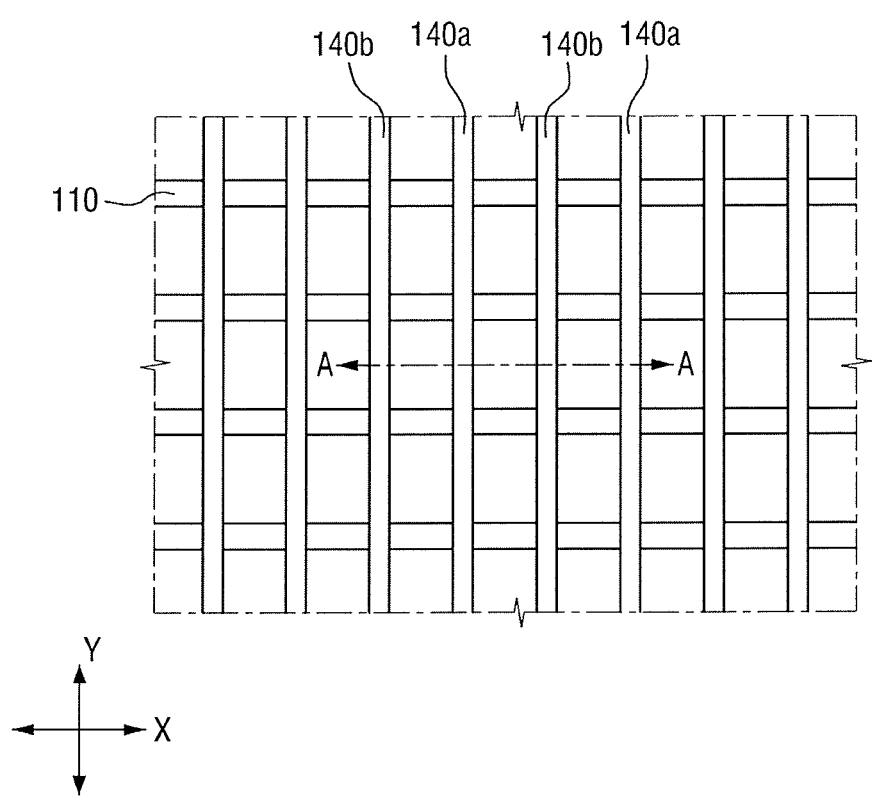
Figure 4:
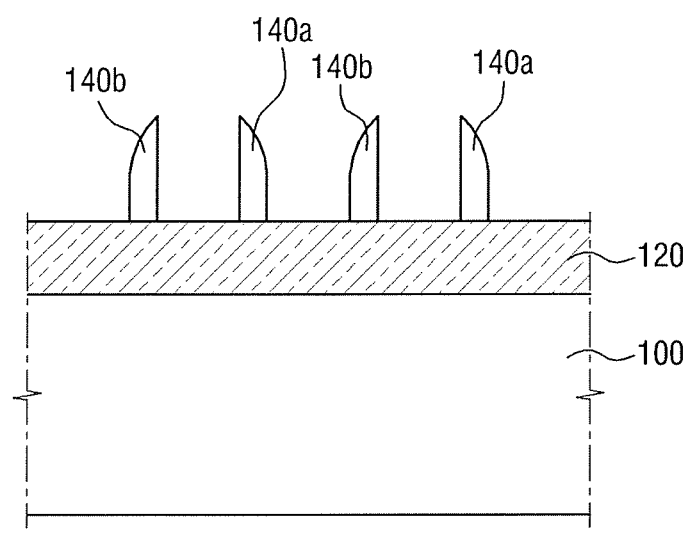
Figure 5:
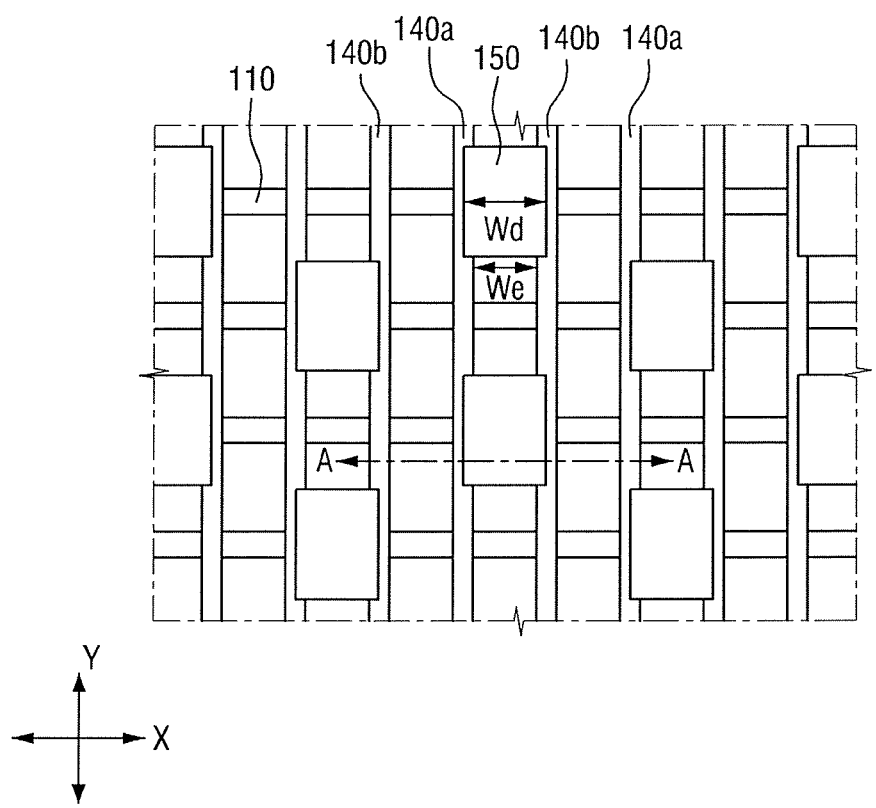
Figure 8:
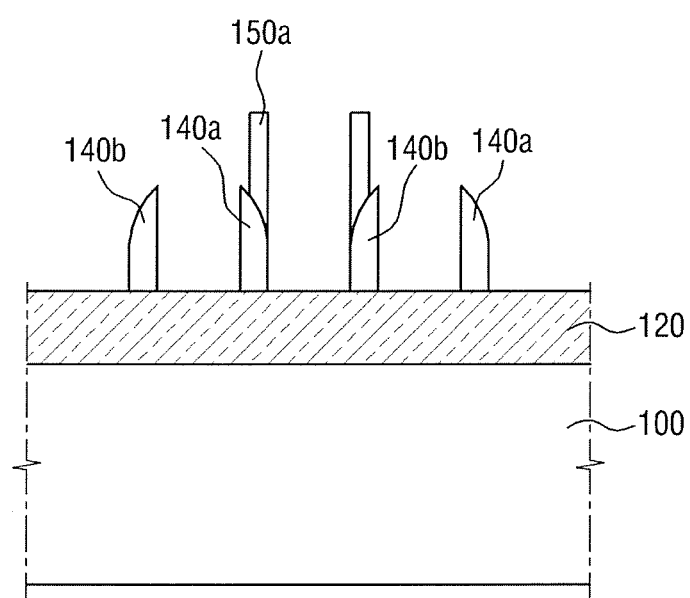
Figure 9:
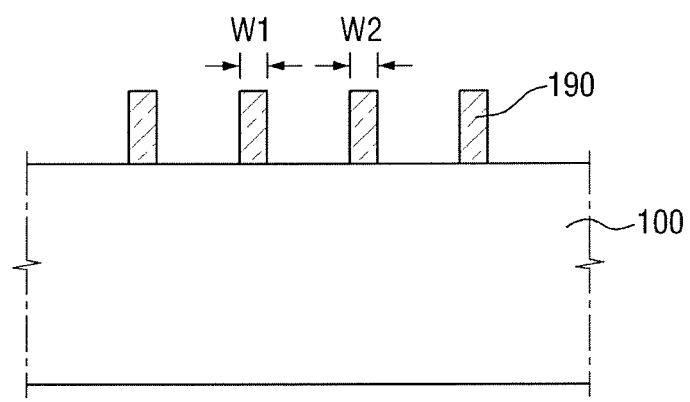
Figure 10:
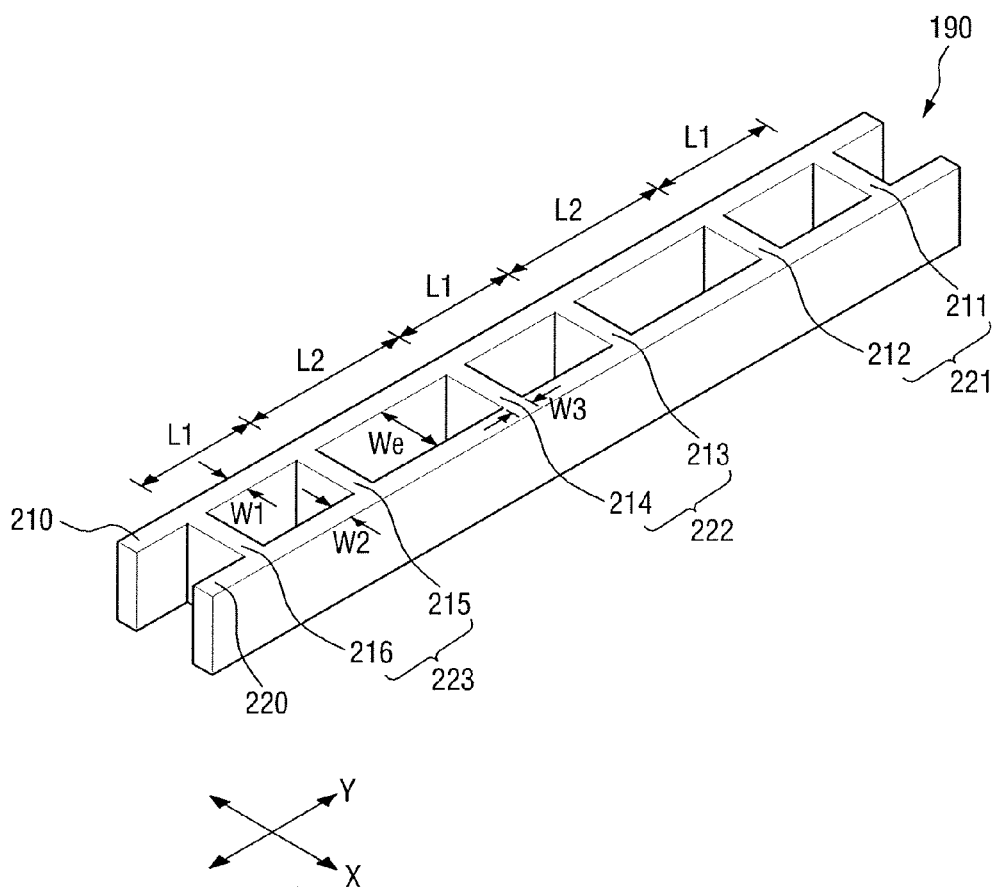
Figure 11:
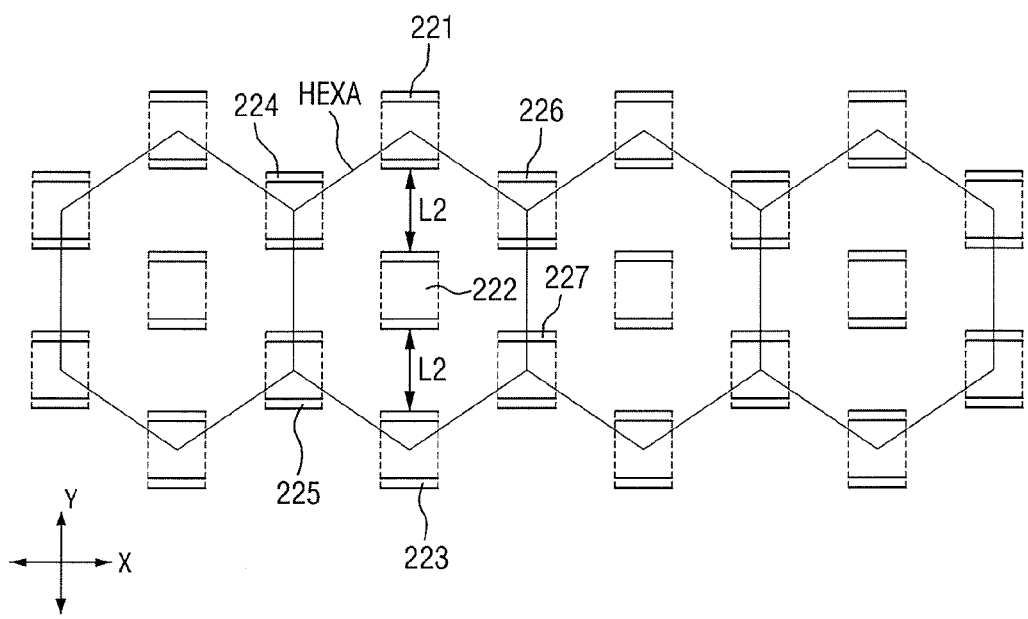
FIG. 11 is a conceptual diagram illustrating a bridge pair according to an exemplary embodiment of the present inventive concept.

FIGS. 1 to 10 illustrate intermediate process steps illustrating a fabricating method of a semiconductor device according to an exemplary embodiment of the present inventive concept. FIGS. 1, 3, 5 and 7 are plan views of the semiconductor device, and FIGS. 2, 4, 6 and 8 are cross-sectional views taken along line A-A of FIGS. 1, 3, 5 and 7, respectively. FIG. 10 is a perspective view illustrating a dummy pattern. FIG. 11 is a conceptual diagram illustrating a bridge pair. Referring to FIGS. 1, 3 and 5, although a plurality of fins are covered by a lower layer, the fins are visible in FIGS. 1, 3 and 5 for convenience of description.

Referring to FIGS. 1 and 2, a plurality of fins 110 is formed on a substrate 100. The plurality of fins 110 extends lengthwise in a first direction X.

The substrate 100 may be, for example, bulk silicon, silicon-on-insulator (SOI, a silicon substrate, or a substrate made of other materials including at least one of, for example, germanium, silicon germanium, indium antimonide, lead telluride compound, indium arsenide, indium phosphide, gallium arsenide, and gallium antimonide. However, the substrate 100 is not limited thereto.

The plurality of fins 110 may be formed by, for example, patterning the substrate 100. The plurality of fins 110 may also be formed by, for example, forming a mold insulation layer on the substrate 100 followed by performing epitaxial growth on the mold insulation layer.

Next, a lower layer 120 is formed on the substrate 100 having the plurality of fins 110 formed thereon. The lower layer 120 may include a material used for forming a gate including, for example, silicon. The lower layer 120 may include at least one of, for example, polycrystalline silicon (poly Si) and amorphous silicon (a-Si). The lower layer 120 may be undoped, doped with an n-type material (e.g., arsenic, phosphorus, etc), or doped with a p-type material (e.g., boron). Alternatively, the lower layer 120 may include a metallic material.

Next, a plurality of first masks 130 are formed on the lower layer 120. The first masks 130 may have the shape of lines extending lengthwise in a second direction Y. The first masks 130 may include, for example, at least one of an oxide layer, a nitride layer and an oxynitride layer.

Next, a second mask 140a and a third mask 140b are formed on opposite sidewalls of each of the first masks 130. The second mask 140a and the third mask 140b may include materials having etching selectivity with respect to the first masks 130. The second mask 140a and the third mask 140b may include, for example, at least one of an oxide layer, a nitride layer and an oxynitride layer. When the first masks 130 are nitride layers, the second mask 140a and the third mask 140b may be, for example, oxide layers.

The second mask 140a and the third mask 140b may each be shaped as spacers. For example, an oxide layer may be formed on a top surface of the lower layer 120 along top surfaces and sidewalls of the first mask 130. An etch-back process may then be performed, thereby forming the second mask 140a and the third mask 140b, each having a spacer shape. Thus, when the second mask 140a and the third mask 140b are defined herein as having a spacer shape, the second mask 140a and the third mask 140b are formed such that they are disposed on the top surface of the lower layer 120 along at least one of top surfaces and sidewalls of the first mask 130.

A width We of the first mask 130 may be substantially equal to or greater than a minimum processing line width. The minimum processing line width may refer to the minimum value of the line width of the first mask 130 in the case of forming the first mask 130 using, for example, a lithography process. Since the second mask 140a and the third mask 140b are formed using a spacer forming process, a width Wa of the second mask 140a and a width Wb of the third mask 140b may be smaller than the minimum processing line width. When an etching process is performed using the second mask 140a and the third mask 140b, a pattern having a width smaller than the minimum processing line width may be formed.

Referring to FIGS. 3 and 4, the first masks 130 are removed. The first masks 130 may be removed by, for example, performing a wet etching process using an etching solution capable of selectively removing the first masks 130.

After removing the first masks 130, the second mask 140a and the third mask 140b may remain on the lower layer 120. Herein, the second mask 140a and the third mask 140b, which were positioned on the opposite sidewalls of the first mask 130, may be referred to as facing each other. The second mask 140a formed on the right sidewall of the first mask 130 positioned at one side (e.g., the leftmost first mask 130 of FIG. 2) and the third mask 140b formed on the left sidewall of the first mask 130 positioned at the other side (e.g., the rightmost first mask 130 of FIG. 2) may be referred to as facing each other.

Figure 6:
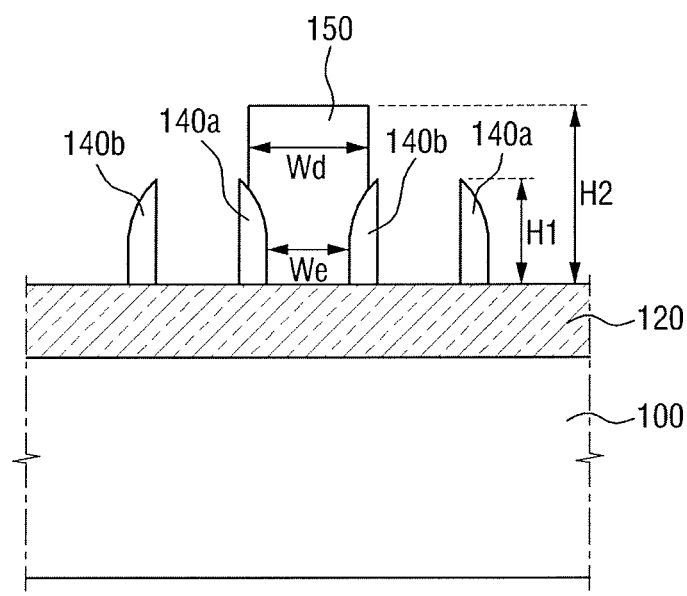

Referring to FIGS. 5 and 6, fourth masks 150 are formed. The fourth masks 150 each connect a portion of the second mask 140a and a portion of the third mask 140b. As shown in FIGS. 5 and 6, the fourth masks 150 may be formed between the second mask 140a and the third mask 140b facing each other.

The fourth masks 150 may be formed as an island type mask rather than as a line type mask. For example, the fourth masks 150 may be sparsely positioned between the second mask 140a and the third mask 140b, rather than being positioned lengthwise along the second mask 140a and the third mask 140b facing each other.

Each of the fourth masks 150 may be, for example, a carbon hard mask. Since the carbon hard mask may be etched by oxygen, it has etching selectivity with respect to most patterns. For example, the carbon hard mask may be formed using a plasma enhanced chemical vapor deposition (PECVD) process. For example, the carbon hard mask may be deposited in a PECVD chamber under conditions of about 300° C. to about 550° C. in temperature and about 1,500 W to about 2,000 W in RF power using a $C_xH_y$ series source gas such as, for example, $C_3H_6$, or $C_2H_2$.

A height H2 of the fourth mask 150 may be greater than a height H1 of the second mask 140a or the third mask 140b as a result of the carbon hard mask having slightly lower etching resistance than an oxide mask. In order to perform an etching process using both the carbon hard mask and the oxide mask, the carbon hard mask may have a greater height than the oxide mask.

As shown in FIG. 5, the fourth masks 150 may be arranged in a zigzag configuration. For example, one of the fourth masks 150 may be surrounded by six other fourth masks 150. For example, the six other fourth masks 150 may be positioned at vertexes of a hexagonal honeycomb structure centered around the one of the fourth masks 150, as described in further detail with reference to FIG. 11.

A width We between the second mask 140a and the third mask 140b facing each other may be smaller than a width Wd of each of the fourth masks 150. For example, portions of the fourth masks 150 may overlap with the second mask 140a and the third mask 140b facing each other.

Figure 7:
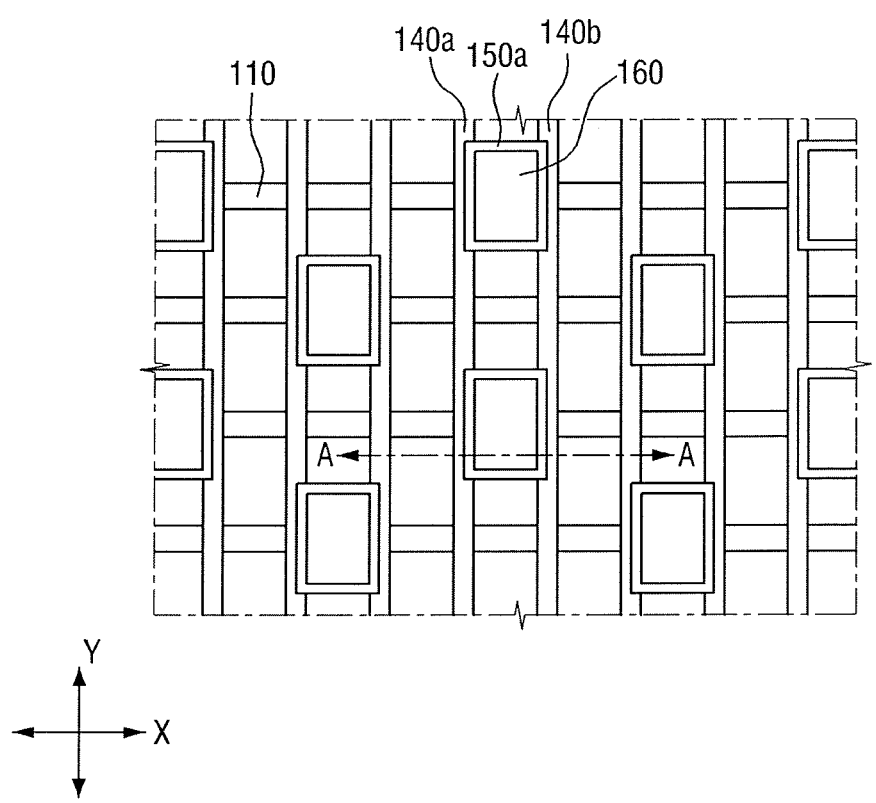

Referring to FIGS. 7 and 8, the portions of the fourth masks 150 are removed by patterning the fourth masks 150.

For example, a fifth mask exposing a central portion of each of the fourth masks 150 is formed on the fourth mask 150. The central portion of the fourth mask 150 is removed using the fifth mask, thereby forming a trench 160 in the fourth mask 150. Thus, fourth mask patterns 150a may be formed. The fourth mask patterns 150a may have a rectangular shape.

Referring to FIGS. 6 and 8, according to an exemplary embodiment of the present inventive concept, a method of fabricating a semiconductor device includes forming a first mask (e.g., 140a in FIGS. 6 and 8) and a second mask (e.g., 140b in FIGS. 6 and 8) on a lower layer 120. The first mask and the second mask face each other. The method further includes forming a third mask (e.g., 150 in FIG. 6) connecting a portion of the first mask and a portion of the second mask between the first mask and the second mask. The method further includes forming a rectangular mask pattern (e.g., 150a in FIG. 8) by removing a portion of the third mask. The rectangular mask pattern may include a first rectangular portion disposed on the first mask and a second rectangular portion disposed on the second mask. The method further includes completing a dummy pattern by patterning the lower layer using the first mask, the second mask and the mask pattern.

Referring to FIGS. 9 and 10, the lower layer 120 is patterned using the second mask 140a, the third mask 140b and the fourth mask patterns 150a, thereby completing a dummy pattern 190.

The dummy pattern 190 includes a first dummy gate 210 having a first width W1, a second dummy gate 220 having a second width W2 and one or more bridges 211 to 216 connecting the first dummy gate 210 and the second dummy gate 220 to each other.

The first dummy gate 210 and the second dummy gate 220 are formed at positions corresponding to the second mask 140a and the third mask 140b facing each other. Therefore, the first dummy gate 210 and the second dummy gate 220 are adjacent to each other in a lengthwise direction. In addition, the first dummy gate 210 and the second dummy gate 220 may be formed to cross fins 110 corresponding thereto.

The first width W1 of the first dummy gate 210 and the second width W2 of the second dummy gate 220 may be smaller than the minimum processing line width as a result of the width Wa of the second mask 140a and the width Wb of the third mask 140b being smaller than the minimum processing line width, as described above. A distance We between the first dummy gate 210 and the second dummy gate 220 may be greater than the first width W1 and the second width W2.

The one or more bridges 211 to 216 are formed at positions corresponding to the fourth mask patterns 150a. Therefore, the one or more bridges 211 to 216 are configured to connect a portion of the first dummy gate 210 and a portion of the second dummy gate 220 to each other.

The one or more bridges 211 to 216 may prevent the first dummy gate 210 and the second dummy gate 220 from collapsing or being inclined.

Shapes of the fourth mask patterns 150a may be adjusted by adjusting overlapping extents of the fourth masks 150 and the fifth masks. As a result, a width W3 of a bridge positioned between the first dummy gate 210 and the second dummy gate 220 may be adjusted. For example, the width W3 of the bridge may be substantially equal to the first width W1 of the first dummy gate 210 or the second width W2 of the second dummy gate 220.

If the overlapping extent of the second masks 140a through the fifth masks are adjusted in the above-described manner, the first dummy gate 210, the second dummy gate 220 and the bridges 211 to 216 may be prevented from being undercut when etching is performed to form the dummy pattern 190. In addition, the first dummy gate 210, the second dummy gate 220 and the bridges 211 to 216 may be prevented from being asymmetrically formed. Therefore, the dummy pattern 190 may be formed in a secure and stable manner, thereby reducing potential defects from being formed in subsequent processes.

The first to sixth bridges 211 to 216 that are sequentially arranged are formed between the first dummy gate 210 and the second dummy gate 220. For convenience of description, 6 bridges 211 to 216 are illustrated in FIG. 10, however, the number of bridges 211 to 216 is not limited thereto. For example, exemplary embodiments may include more than 6 bridges or less than 6 bridges according to the lengths of the dummy gates 210 and 220.

A distance L1 between the first bridge 211 and the second bridge 212, a distance L1 between the third bridge 213 and the fourth bridge 214 and a distance L1 between the fifth bridge 215 and the sixth bridge 216 may be substantially equal to one another.

The distance L1 between the first bridge 211 and the second bridge 212, the distance L1 between the third bridge 213 and the fourth bridge 214 and the distance L1 between the fifth bridge 215 and the sixth bridge 216 may be smaller than a distance L2 between the second bridge 212 and the third bridge 213 or a distance L2 between the fourth bridge 214 and the fifth bridge 215.

The first bridge 211 and the second bridge 212 positioned near each other may form a first bridge pair 221, the third bridge 213 and the fourth bridge 214 positioned near each other may form a second bridge pair 222, and the fifth bridge 215 and the sixth bridge 216 positioned near each other may form a third bridge pair 223.

Referring to FIG. 11, a plurality of bridge pairs 221 to 227 may be formed between each of a plurality of dummy gates.

Some bridge pairs (e.g., bridge pairs 221 and 223 to 227) from among the plurality of bridge pairs 221 to 227 may be positioned such that they are centered around one bridge pair (e.g., bridge pair 222) from among the plurality of bridge pairs 221 to 227. For example, some bridge pairs (e.g., 6 bridge pairs 221 and 223 to 227) may surround one bridge pair (e.g., bridge pair 222). That is, some bridge pairs (e.g., 6 bridge pairs 221 and 223 to 227) may be positioned at vertexes of a hexagonal honeycomb structure (HEXA) centered around the one bridge pair (e.g., bridge pair 222). That is, the bridge pairs may form a hexagonal honeycomb structure in which one of the bridge pairs is at the center of the hexagonal honeycomb structure, and the other bridge pairs are positioned at vertexes of the hexagonal honeycomb structure.

In an exemplary embodiment, first to sixth dummy gates are adjacent to one another in a lengthwise direction and are sequentially arranged in that order. Referring to this embodiment, when dummy gates are described as being sequentially arranged, it refers to a configuration in which no other dummy gate intervenes between the sequentially arranged dummy gates. For example, when first to sixth dummy gates are sequentially arranged in order, the first and second dummy gates are adjacent to each other with no intervening dummy gates, the second and third dummy gates are adjacent to each other with no intervening dummy gates, the third and fourth dummy gates are adjacent to each other with no intervening dummy gates, the fourth and fifth dummy gates are adjacent to each other with no intervening dummy gates, and the fifth and sixth dummy gates are adjacent to each other with no intervening dummy gates.

In FIG. 11, one or more bridges (e.g., the bridge pairs 224 and 225) are arranged between the first and second dummy gates, one or more bridges (e.g., the bridge pairs 221, 222 and 223) are arranged between the third and fourth dummy gates, and one or more bridges (e.g., the bridge pairs 226 and 227) are arranged between the fifth and sixth dummy gates. In an exemplary embodiment, the bridge pairs 221, 222 and 223, and the bridge pairs 226 and 227 are not formed on substantially the same line (e.g., a line extending in the first direction X). That is, the bridge pairs 221, 222 and 223 may not line up with the bridge pairs 226 and 227. The bridge pairs 224 and 226 are formed on substantially the same line (e.g., a line extending in the first direction X), and the bridge pairs 225 and 227 are formed on substantially the same line (e.g., a line extending in the first direction X). Thus, according to an exemplary embodiment, bridge pairs may be formed on substantially the same line in an alternating pattern.

In addition, as shown in FIG. 11, there are no bridges formed between the second and third dummy gates, and there are no bridges formed between the fourth and fifth dummy gates. The pattern described with reference to the first to sixth dummy gates and the bridge pairs 221 to 227 as shown in FIG. 11 may be continuously repeated.

Referring still to FIG. 11, according to an exemplary embodiment, a first bridge (e.g., a bridge from the bridge pair 224) is formed between and connects the first and second dummy gates to each other, and a second bridge (e.g., a bridge from the bridge pair 221) is formed between and connects the third and fourth dummy gates to each other. An area between the third and fourth dummy gates that is in a substantially same line (e.g., a line extending in the first direction X) as the first bridge does not include the second bridge or another bridge. Further, there are no bridges formed between the second and third dummy gates or between the fourth and fifth dummy gates. A third bridge (e.g., a bridge from the bridge pair 226) is formed between the fifth and sixth dummy gates. The first and third bridges are formed substantially in a same line (e.g., a line extending in the first direction X), and the second bridge is not formed in substantially the same line as the first and third bridges. This pattern may be continuously repeated.

As described above, if the bridge pairs 221 to 227 are arranged in the hexagonal honeycomb structure HEXA, the distances L2 from one bridge pair (e.g., bridge pair 222) to multiple bridge pairs (e.g., bridge pairs 221 and 223) adjacent to the one bridge (e.g., bridge pair 222) may become substantially equal to one another (e.g., due to the hexagonal shape). Therefore, during etching, the bridge pairs 221 to 223 may support the plurality of dummy gates 210 and 220 uniformly such that they do not lean toward any side.

FIGS. 12 to 17 illustrate intermediate process steps illustrating a fabricating method of a semiconductor device according to an exemplary embodiment of the present inventive concept. For convenience of description, further description of substantially similar elements and processes described above with reference to FIGS. 1 to 11 may be omitted herein.

Figure 12:
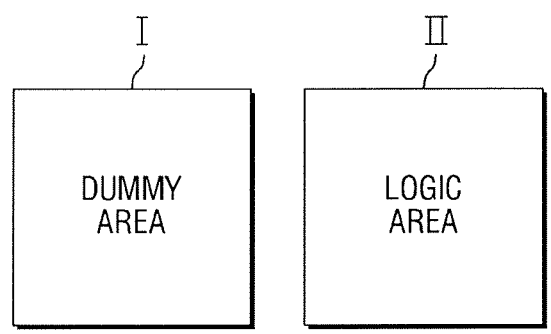
FIGS. 12 to 17 illustrate intermediate process steps illustrating a fabricating method of a semiconductor device according to an exemplary embodiment of the present inventive concept.

Referring to FIG. 12, a substrate may include a first region I and a second region II. For example, the first region I may be a dummy area and the second region II may be a logic area, however, exemplary embodiments the present inventive concept are not limited thereto. The dummy area may correspond to a region in which a dummy pattern is formed to increase a pattern density and patternability.

As will be described in further detail below, a process of forming the dummy pattern in the dummy area and a process of forming a logic pattern in the logic area may be simultaneously performed.

Figure 13:
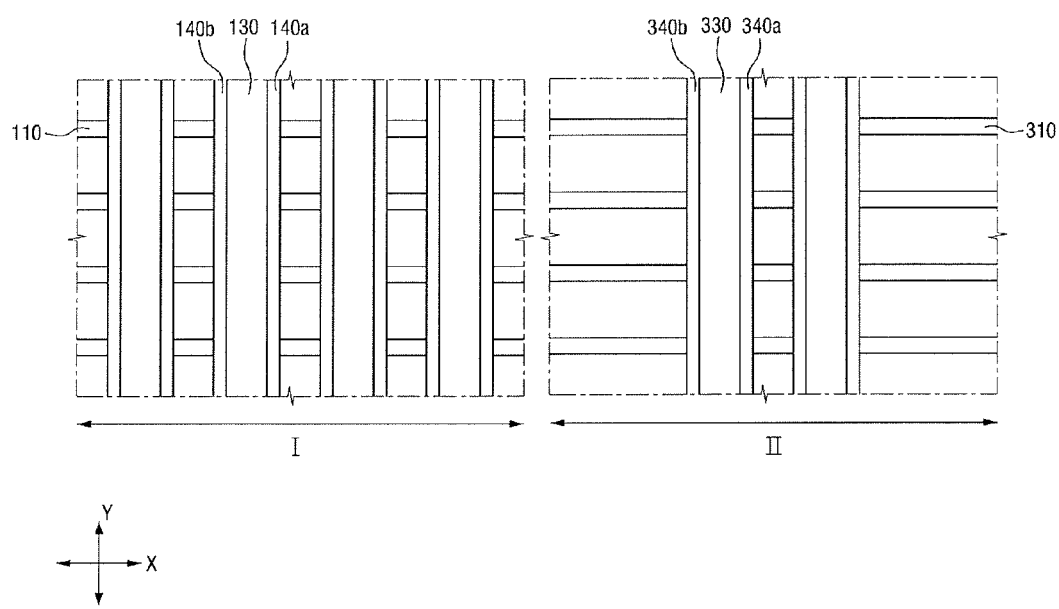

Referring to FIG. 13, a plurality of first fins 110 is formed on the first region I of the substrate 100 and a plurality of second fins 310 is formed on the second region II of the substrate 100. The first fins 110 and the second fins 310 may be formed to be substantially parallel to each other in the same direction (e.g., in the first direction X), as illustrated in FIG. 13, however, exemplary embodiments of the present inventive concept are not limited thereto. For example, in an exemplary embodiment, the first fins 110 and the second fins 310 may not be formed to be substantially parallel to each other.

A first lower layer (e.g., lower layer 120 of FIG. 2) is formed on the first region I and a second lower layer is formed on the second region II. The first and second lower layers may include a material used for forming a gate including, for example, silicon or a metal.

Next, a plurality of first masks 130 are formed on the first lower layer of the first region I and a plurality of sixth masks 330 are formed on the second lower layer of the second region II. The first masks 130 may be formed to cross the plurality of first fins 110 and the sixth masks 330 may be formed to cross the plurality of second fins 310. The first masks 130 and the sixth masks 330 may be simultaneously formed using the same material. For example, the first masks 130 and the sixth masks 330 may include at least one of an oxide layer, a nitride layer and an oxynitride layer. The first masks 130 and the sixth masks 330 may be shaped as lines, respectively.

Although FIG. 13 illustrates the first masks 130 and the sixth masks 330 formed such that they are substantially parallel to each other in the same direction (e.g., in the second direction Y), exemplary embodiments of the present inventive concept are not limited thereto. For example, in an exemplary embodiment, the first masks 130 and the sixth masks 330 may be formed such that they are not substantially parallel to each other.

Next, in the first region I, a second mask 140a and a third mask 140b may be formed on opposite sidewalls of each of the first masks 130. In addition, in the second region II, a seventh mask 340a and an eighth mask 340b may be formed on opposite sidewalls of each of the sixth masks 330.

The seventh mask 340a and the eighth mask 340b may be simultaneously formed using the same material with the second mask 140a and the third mask 140b. The seventh mask 340a and the eighth mask 340b may include material(s) having etching selectivity with respect to the sixth masks 330. For example, the seventh mask 340a and the eighth mask 340b may include at least one of an oxide layer, a nitride layer and an oxynitride layer. For example, when the sixth masks 330 are nitride layers, the seventh mask 340a and the eighth mask 340b may be oxide layers.

The seventh mask 340a and the eighth mask 340b may be shaped as spacers relative to the sixth mask 330 (e.g., the seventh mask 340a and the eighth mask 340b may face each other and be disposed on sides of the sixth mask 330). A width of each of the sixth masks 330 may be substantially equal to or greater than the minimum processing line width. Since the seventh mask 340a and the eighth mask 340b are formed using a spacer forming process, a width of the seventh mask 340a and a width of the eighth mask 340b may be smaller than the minimum processing line width. When etching is performed using the seventh mask 340a and the eighth mask 340b, a pattern having a smaller width than the minimum processing line width may be formed.

Figure 14:
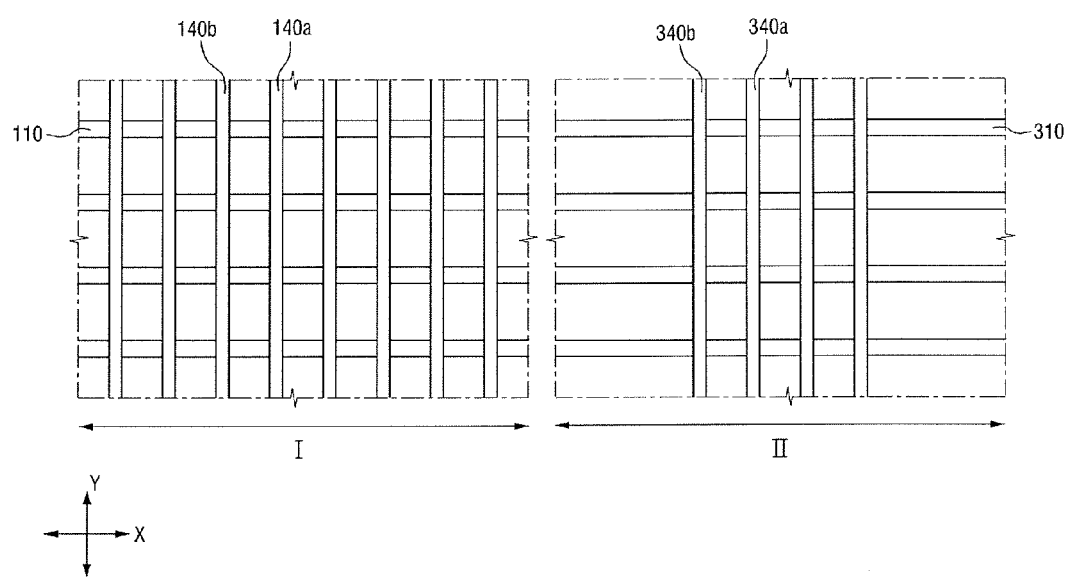

Referring to FIG. 14, the first masks 130 are removed from the first region I and the sixth masks 330 are removed from the second region II. For example, a wet etching process may be performed using an etching solution capable of selectively removing the first masks 130 and the sixth masks 330.

After removing the first masks 130, the second mask 140a and the third mask 140b may remain on the first lower layer. After removing the sixth masks 330, the seventh mask 340a and the eighth mask 340b remain on the second lower layer.

Figure 15:
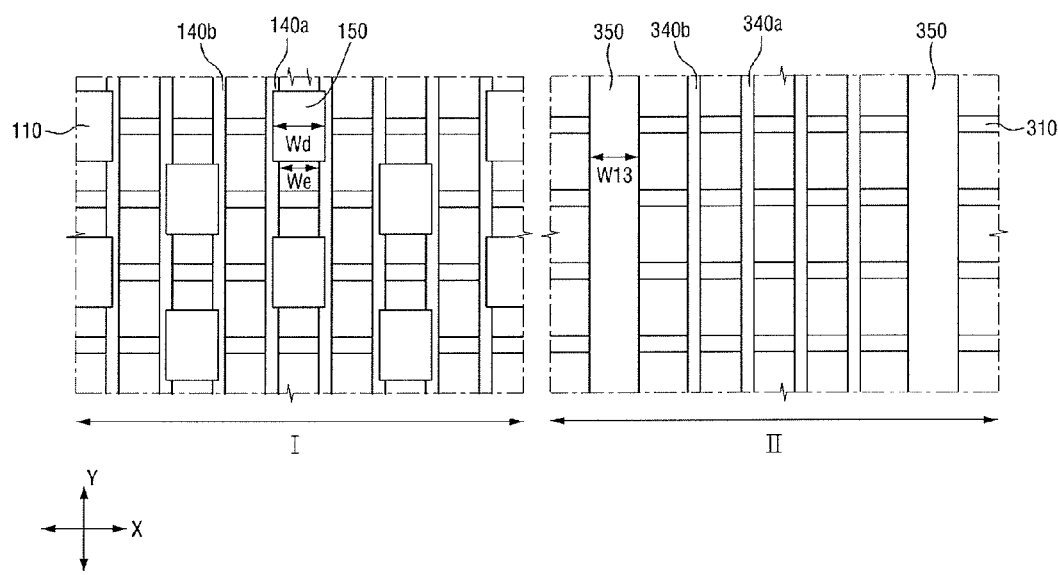

Referring to FIG. 15, fourth masks 150 are formed. The fourth masks 150 each connect a portion of the second mask 140a and a portion of the third mask 140b in the first region I. As shown in FIG. 15, the fourth masks 150 may be formed between the second mask 140a and the third mask 140b facing each other. The fourth mask 150 may be formed as an island type mask rather than as a line type mask.

In the second region II, ninth masks 350 are formed to be spaced apart from the seventh mask 340a and the eighth mask 340b. The ninth masks 350 may be formed as a line type mask rather than as an island type mask. The lengthwise direction in which the ninth masks 350 extend (e.g., direction Y) may be substantially the same as the lengthwise direction in which the seventh mask 340a and the eighth mask 340b extend (e.g., direction Y). In addition, the ninth masks 350 may be adjacent to the seventh mask 340a and the eighth mask 340b in a lengthwise direction. In addition, the ninth masks 350 may be formed to cross the plurality of second fins 310. A width of each of the ninth masks 350 may be substantially equal to or greater than the minimum processing line width.

Similar to the fourth mask 150, each of the ninth masks 350 may be, for example, a carbon hard mask. A height of each of the ninth masks 350 may be greater than a height of each of the seventh mask 340a and the eighth mask 340b.

A width We between the second mask 140a and the third mask 140b facing each other may be smaller than a width Wd of each of the fourth masks 150. For example, portions of the fourth masks 150 may overlap with the second mask 140a and the third mask 140b facing each other. A width W13 of each of the ninth masks 350 may be substantially equal to the width Wd of each of the fourth masks 150. For example, the width W13 of each of the ninth masks 350 may be greater than the width We between the second mask 140a and the third mask 140b.

Figure 16:
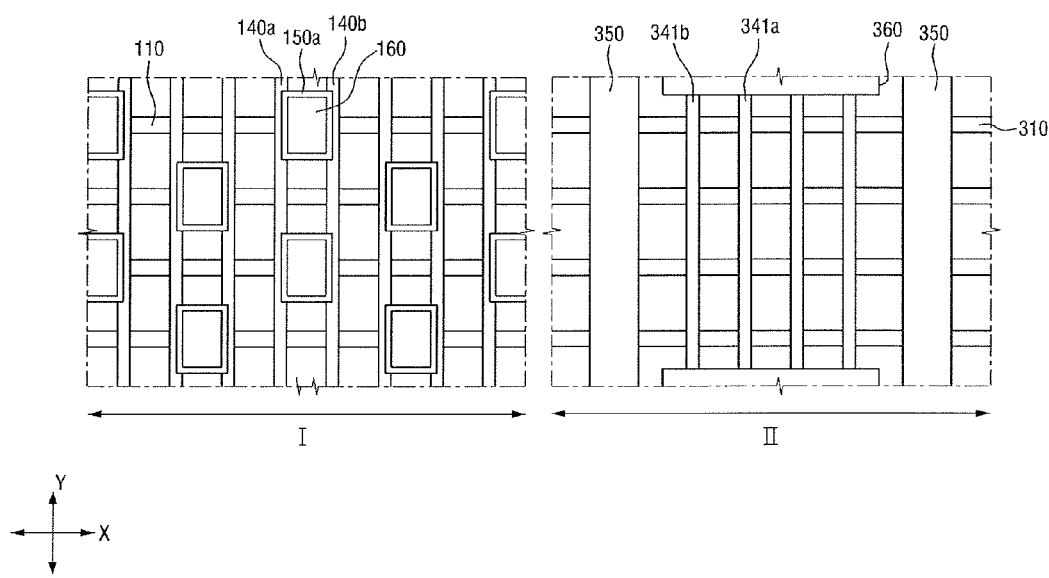

Referring to FIG. 16, the portions of the fourth masks 150 are removed by patterning the fourth masks 150.

At substantially the same time, portions of the seventh mask 340a and the eighth mask 340b are cut using a tenth mask, thereby forming a seventh mask pattern 341a and an eighth mask pattern 341b. v As a result of the cutting, a trench 360 may be formed at one side of each of the seventh mask pattern 341a and the eighth mask pattern 341b.

As shown in FIG. 16, the seventh mask 340a and the eighth mask 340b are cut, however, exemplary embodiments of the present inventive concept are not limited thereto. For example, according to exemplary embodiments, the ninth masks 350 may be cut, the seventh mask 340a, the eighth mask 340b and the ninth mask 350 may all be cut, or the seventh mask 340a and the ninth mask 350 may be cut.

Next, the lower layer is patterned using the second mask 140a, the third mask 140b and the fourth mask patterns 150a, thereby completing the dummy pattern 190. At substantially the same time, the second lower layer is patterned using the seventh mask pattern 341a and the eighth mask pattern 341b, thereby completing a logic pattern 390 (see FIG. 17).

Figure 17:
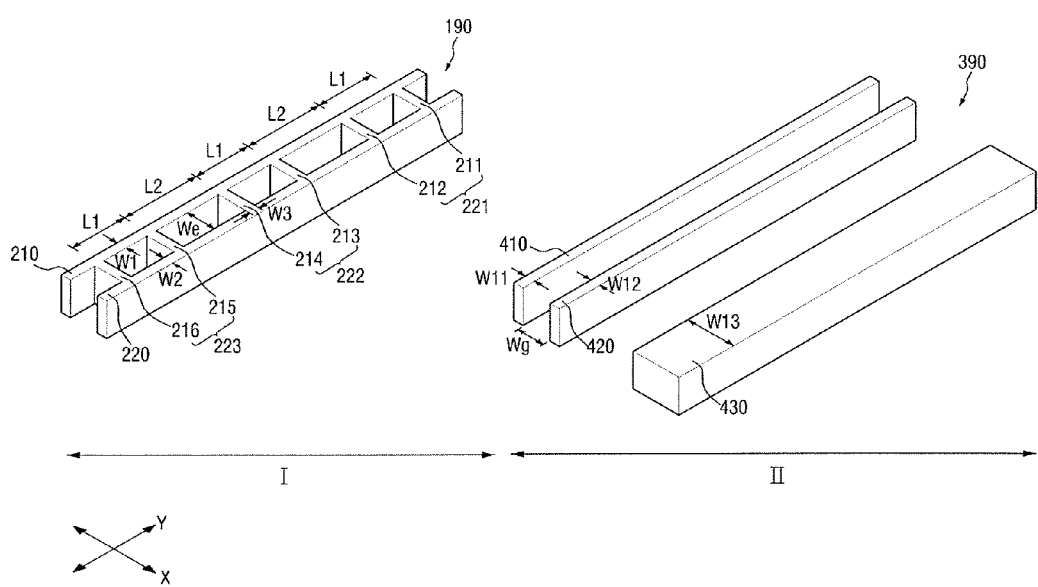

Referring to FIG. 17, the dummy pattern 190 includes a first dummy gate 210 having a first width W1, a second dummy gate 220 having a second width W2, and one or more bridges 211 to 216 connecting the first dummy gate 210 and the second dummy gate 220.

The logic pattern 390 may include a first gate 410 having a third width W11 and a second gate 420 having a fourth width W12. In addition, the logic pattern 390 may further include a third gate 430 having a fifth width W13 greater than the third width W11 and the fourth width W12.

The third width W11 of the first gate 410 and the fourth width W12 of the second gate 420 may be smaller than the minimum processing line width as a result of the width of the seventh mask 340a and the width of the eighth mask 340b being smaller than the minimum processing line width, as described above.

The fifth width W13 of the third gate 430 may be substantially equal to or greater than the minimum processing line width as a result of the width of each of the ninth masks 350 being substantially equal to or greater than the minimum processing line width, as described above.

The fifth width W13 of the third gate 430 may be greater than a distance Wg between the first gate 410 and the second gate 420. The fifth width W13 of the third gate 430 may be greater than the distance We between the first dummy gate 210 and the second dummy gate 220. The distance Wg between the first gate 410 and the second gate 420 and the distance We between the first dummy gate 210 and the second dummy gate 220 may be substantially equal to each other.

Figure 18:
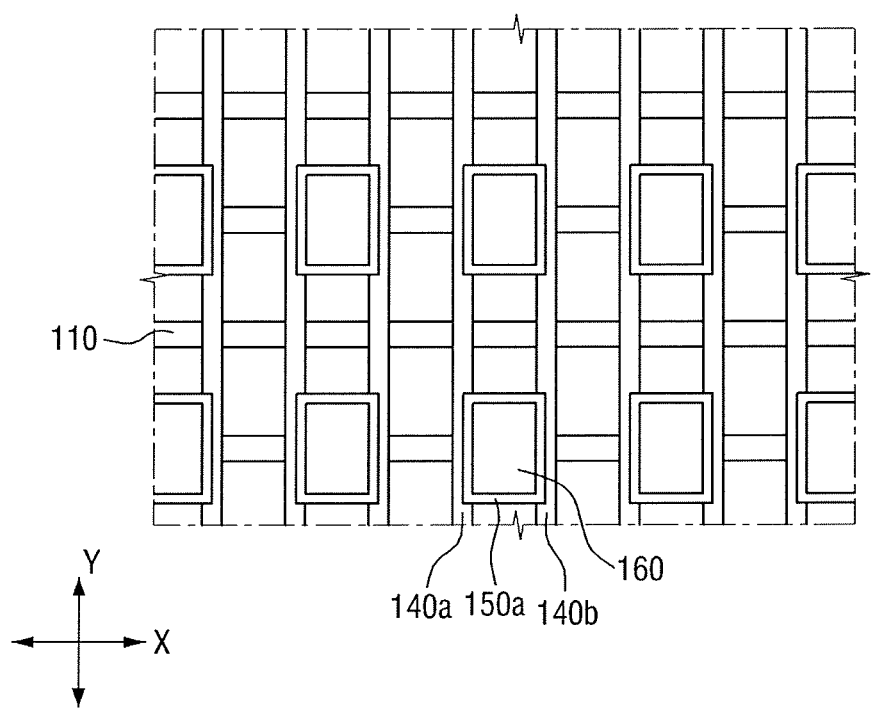
FIG. 18 is a plan view illustrating a fabricating method of a semiconductor device according to an exemplary embodiment of the present inventive concept.
Figure 19:
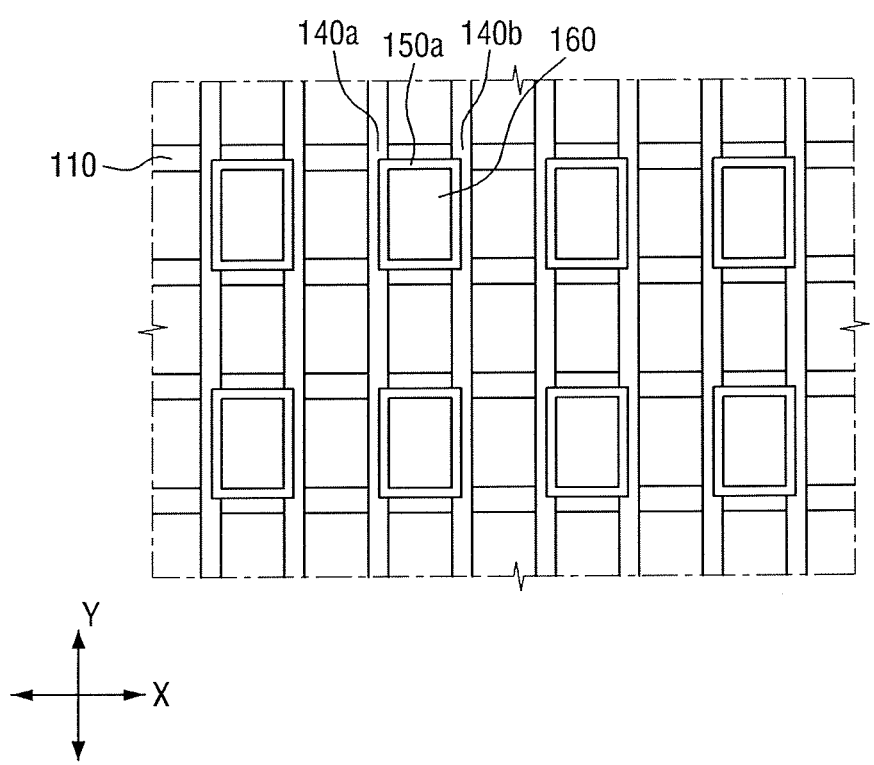
FIG. 19 is a plan view illustrating a fabricating method of a semiconductor device according to an exemplary embodiment of the present inventive concept.

FIGS. 18 and 19 are plan views illustrating fabricating methods of semiconductor devices according to exemplary embodiments of the present inventive concept. For convenience of description, further description of substantially similar elements and processes described above with reference to FIGS. 1 to 11 may be omitted herein.

In the semiconductor fabricating method according to exemplary embodiments of the present inventive concept described above, one of the fourth mask patterns 150a is surrounded by 6 other fourth mask patterns 150a. For example, the six other fourth mask patterns 150a may be positioned at vertexes of a hexagonal honeycomb structure centered around one of the fourth mask patterns 150a. As a result, bridge pairs (e.g., bridge pairs 221 to 227 of FIG. 11) may be positioned at vertexes of the hexagonal honeycomb structure.

Referring to FIGS. 18 and 19, the fourth mask patterns 150a may be positioned at vertexes of a square structure or a rectangular structure. However, the fourth mask patterns 150a are not positioned within the square structure or the rectangular structure.

For example, as shown in FIG. 18, one of the fourth mask patterns 150a may overlap with one of the plurality of fins 110. In addition, as shown in FIG. 19, one of the fourth mask patterns 150a may overlap with two of the plurality of fins 110.

Figure 20:
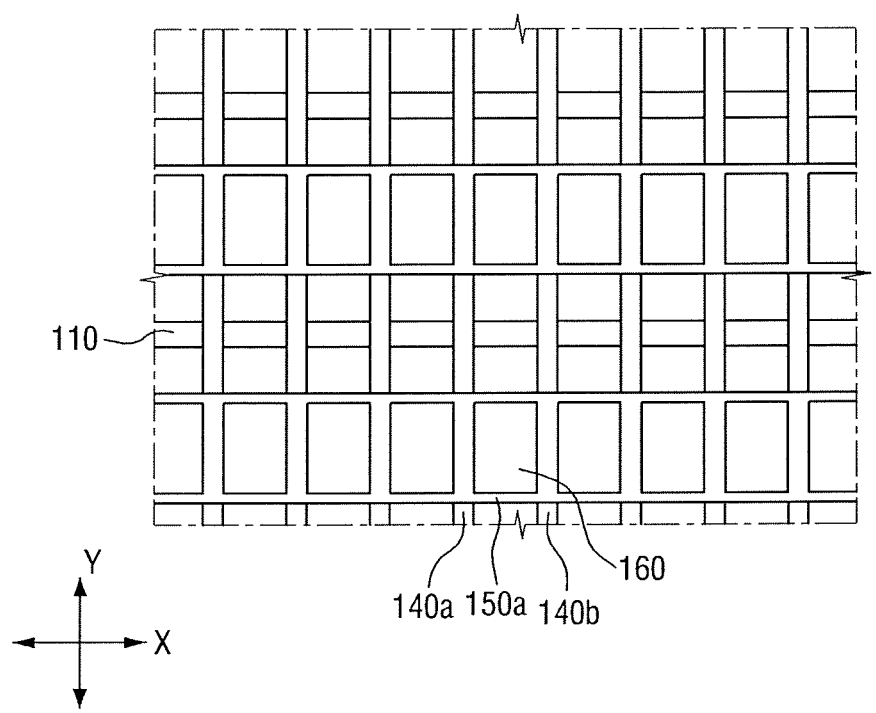
FIG. 20 is a plan view illustrating a fabricating method of a semiconductor device according to an exemplary embodiment of the present inventive concept.

FIG. 20 is a plan view illustrating a fabricating method of a semiconductor device according to an exemplary embodiment of the present inventive concept. For convenience of description, further description of substantially similar elements and processes described above may be omitted herein.

Referring to FIG. 20, in an exemplary embodiment, the fourth mask patterns 150a may be formed as a line type mask pattern rather than as an island type mask pattern. For example, the fourth masks 150 may extend lengthwise in the first direction X and may overlap with a plurality of second masks 140a and a plurality of third masks 140b. In this case, fifth masks may be formed to expose portions between each of the second masks 140a and the third masks 140b facing each other and portions between each of the second masks 140a and the third masks 140b facing each other. Therefore, a trench 160 may be positioned between each of the second masks 140a and the third masks 140b.

For example, in an exemplary embodiment in which the first to fourth dummy gates are sequentially arranged, a bridge formed between the first dummy gate and the second dummy gate, and a bridge formed between the second dummy gate and the third dummy gate, may be positioned on the same line (e.g., a line extending in the first direction X). In addition, bridges formed between the third dummy gate and the fourth dummy gate may also be positioned on the same line.

Figure 21:
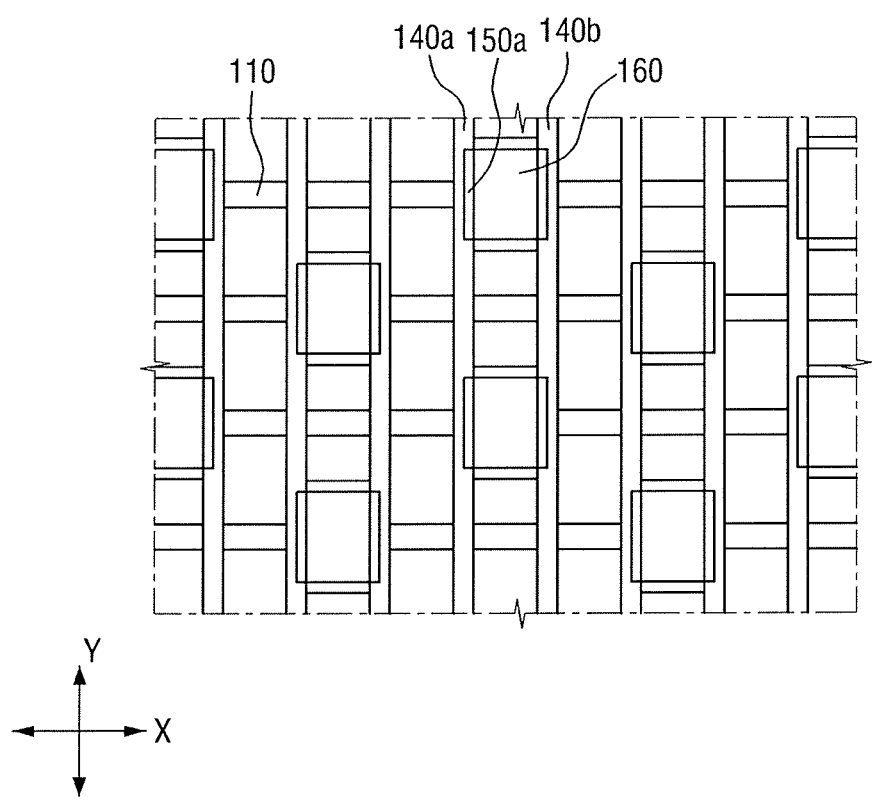
FIGS. 21 and 22 are plan views illustrating a fabricating method of a semiconductor device according to an exemplary embodiment of the present inventive concept.
Figure 22:
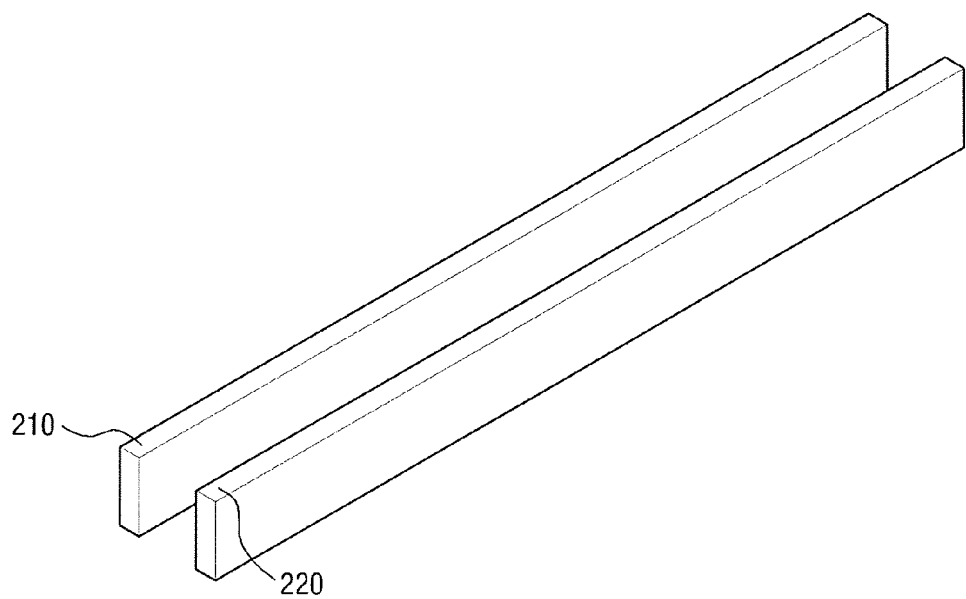

FIGS. 21 and 22 are plan views illustrating a fabricating method of a semiconductor device according to an exemplary embodiment of the present inventive concept. For convenience of description, further description of substantially similar elements and processes described above may be omitted herein.

As described above, shapes of the fourth mask patterns 150a may be adjusted by adjusting overlapping extents of the fourth masks 150 and the fifth masks. As a result, a width of a bridge positioned between the first dummy gate 210 and the second dummy gate 220 may be adjusted. For example, as shown in FIGS. 21 and 22, the width of the bridge may be adjusted to become about 0, indicating that no bridge intervenes between the first dummy gate 210 and the second dummy gate 220.

Figure 23:
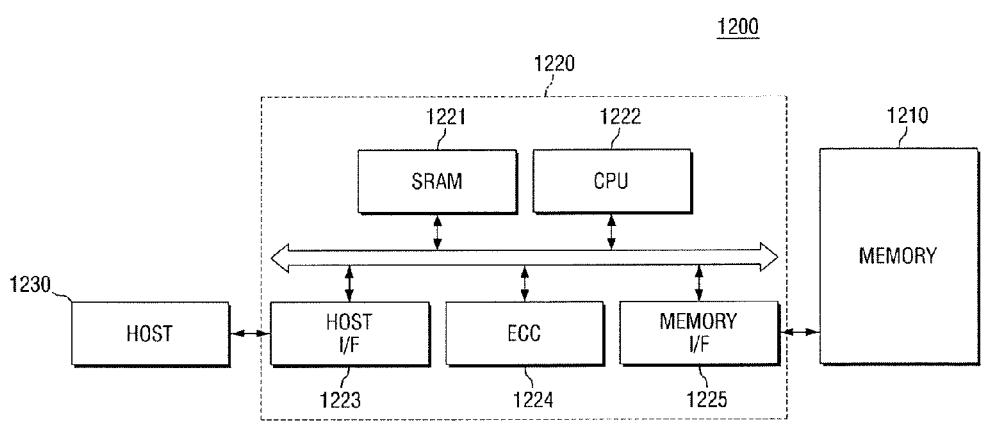
FIG. 23 is a block diagram of a memory card including a semiconductor device fabricated using a semiconductor device fabricating method according to exemplary embodiments of the present inventive concept.

FIG. 23 is a block diagram of a memory card including a semiconductor device fabricated using a semiconductor device fabricating method according to exemplary embodiments of the present inventive concept.

Referring to FIG. 23, a memory 1210 including a semiconductor device according to various exemplary embodiments of the present inventive concept may be employed to the memory card 1200. The memory card 1200 may include a memory controller 1220 controlling data exchange between a host 1230 and a memory 1210. A static random-access memory (SRAM) 1221 may be used as a working memory of a central processing unit (CPU) 1222. A host interface 1223 may include a protocol for exchanging data to allow the host 1230 to access the memory card 1200. An error correction code (ECC) 1224 may be used to detect and correct error(s) of data read from the memory 1210. A memory interface 1225 may interface with the memory 1210. The central processing unit 1222 may perform the overall control operation associated with the data exchange of the memory controller 1220.

Figure 24:
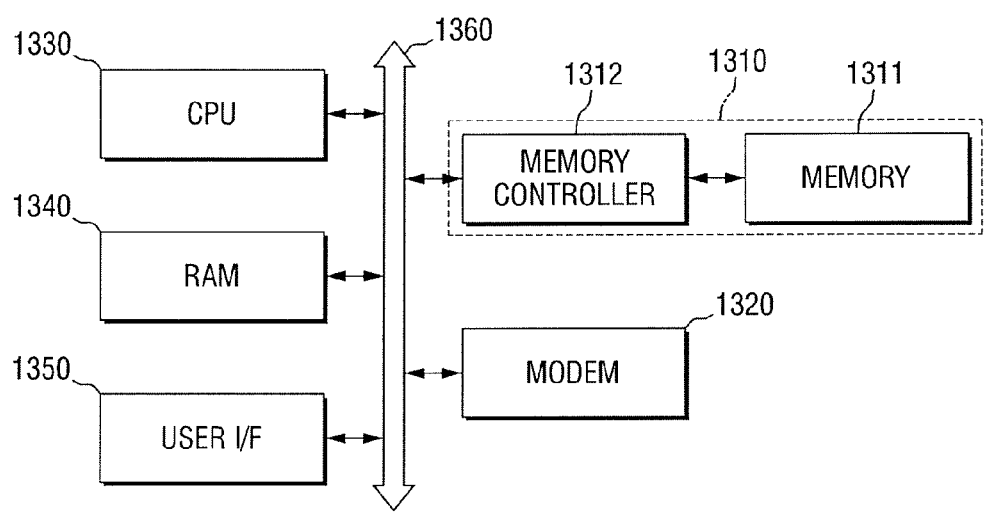
FIG. 24 is a block diagram of an information processing system using a semiconductor device fabricated using a semiconductor device fabricating method according to exemplary embodiments of the present inventive concept.

FIG. 24 is a block diagram of an information processing system using a semiconductor device fabricated using a semiconductor device fabricating method according to exemplary embodiments of the present inventive concept.

Referring to FIG. 24, the information processing system 1300 may include a memory system 1310 including a semiconductor device fabricated using a semiconductor device fabricating method according to exemplary embodiments of the present inventive concept. The information processing system 1300 may include a memory system 1310, a modem 1320, a central processing unit (CPU) 1330, a random access memory (RAM) 1340 and a user interface (I/F) 1350, which are electrically connected to a system bus 1360. The memory system 1310 may include a memory 1311 and a memory controller 1312 and may have substantially the same configuration as that of the memory card 1200 shown in FIG. 23. The data processed by the central processing unit 1330 or the data received from an external device may be stored in the memory system 1310. The information processing system 1300 may be applied to, for example, a memory card, a solid state drive (SSD), a camera image sensor and other various chipsets. For example, the memory system 1310 may employ an SSD. In this case, the information processing system 1300 can process a large amount of data in a stable, reliable manner.

Figure 25:
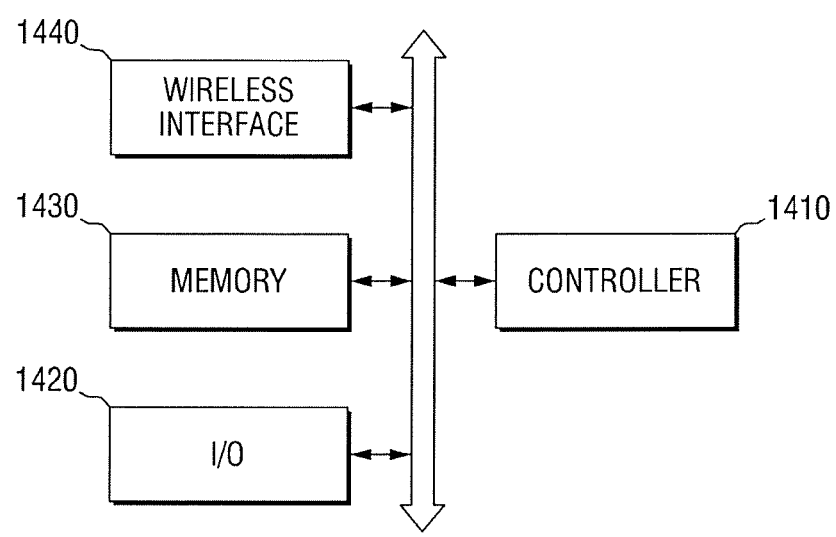
FIG. 25 is a block diagram of an electronic system including semiconductor devices fabricated using a semiconductor device fabricating method according to exemplary embodiments of the present inventive concept.

FIG. 25 is a block diagram of an electronic system including semiconductor devices fabricated using a semiconductor device fabricating method according to exemplary embodiments of the present inventive concept.

Referring to FIG. 25, the electronic system 1400 may include semiconductor devices fabricated using a semiconductor device fabricating method according to exemplary embodiments of the present inventive concept.

The electronic system 1400 may be applied to a wireless communication device such as, for example, a personal digital assistant (PDA), a notebook computer, a portable computer, a tablet computer, a wireless phone, a wireless digital music player, or any type of electronic device capable of transmitting and/or receiving information in a wireless environment.

The electronic system 1400 may include a controller 1410, an input/output device (I/O) 1420, a memory 1430, and a wireless interface 1440. The memory 1430 may include semiconductor devices fabricated using a semiconductor device fabricating method according to exemplary embodiments of the present inventive concept. For example, the controller 1410 may include at least one of a microprocessor, a digital signal processor, etc. The memory 1430 may store commands (or user data) processed by the controller 1410. The wireless interface 1440 may be used to transmit data to a wireless data network or receive data from the communication network.

The wireless interface 1440 may include, for example, an antenna or a wireless transceiver. The electronic system 1400 may use a third or fourth generation communication system protocol, such as, for example, CDMA, GSM, NADC, E-TDMA, WCDMA, CDMA2000, or LTE.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A semiconductor device, comprising:
   a first dummy gate having a first width;
   a second dummy gate adjacent to the first dummy gate in a lengthwise direction and having a second width; and
   a first bridge connecting the first dummy gate and the second dummy gate to each other,
   wherein the first width and the second width are smaller than a minimum processing line width.

2. The semiconductor device of claim 1, wherein the first dummy gate and the second dummy gate cross a plurality of fins of the semiconductor device.

3. The semiconductor device of claim 1, wherein a distance between the first dummy gate and the second dummy gate is greater than the first width and the second width.

4. The semiconductor device of claim 1, further comprising:
   a second bridge, a third bridge and a fourth bridge, wherein the first to fourth bridges are sequentially arranged between the first dummy gate and the second dummy gate,
   wherein a first distance between the first bridge and the second bridge and a second distance between the third bridge and the fourth bridge are substantially equal to each other, and the first distance between the first bridge and the second bridge is smaller than a third distance between the second bridge and the third bridge.

5. The semiconductor device of claim 1, further comprising:
   a third dummy gate, a fourth dummy gate, a fifth dummy gate and a sixth dummy gate,
   wherein the third to sixth dummy gates are adjacent to the first and second dummy gates in the lengthwise direction, and the first to sixth dummy gates are sequentially arranged in an order of the first dummy gate, the second dummy gate, the third dummy gate, the fourth dummy gate, the fifth dummy gate and the sixth dummy gate.

6. The semiconductor device of claim 5, further comprising:
   a second bridge connecting the third dummy gate and the fourth dummy gate to each other.

7. The semiconductor device of claim 6, wherein the first bridge is formed between the first dummy gate and the second dummy gate, and an area between the third dummy gate and the fourth dummy gate that is in a substantially same line as the first bridge does not include the second bridge or another bridge.

8. The semiconductor device of claim 7, wherein there are no bridges formed between the second dummy gate and the third dummy gate.

9. The semiconductor device of claim 6, wherein the first bridge is formed between the first dummy gate and the second dummy gate, a third bridge is formed between the fifth dummy gate and the sixth dummy gate, and the first bridge and the third bridge are formed substantially in a same line.

10. The semiconductor device of claim 9, wherein the second bridge is not formed in substantially the same line as the first and third bridges.

11. The semiconductor device of claim 1, wherein a width of the first bridge is substantially equal to the first width and the second width.

12. A semiconductor device, comprising:
    a first dummy gate having a first width;
    a second dummy gate adjacent to the first dummy gate in a lengthwise direction and having a second width;
    a first bridge connecting the first dummy gate and the second dummy gate to each other;
    a first gate having a third width;
    a second gate adjacent to the first gate in the lengthwise direction and having a fourth width; and
    a third gate having a fifth width greater than the third width and the fourth width,
    wherein the fifth width is greater than a distance between the first dummy gate and the second dummy gate.

13. The semiconductor device of claim 12, wherein the first width, the second width, the third width and the fourth width are smaller than a minimum processing line width.

14. The semiconductor device of claim 12, wherein the fifth width is substantially equal to or greater than a minimum processing line width.

15. The semiconductor device of claim 12, wherein there are no bridges formed between the first gate and the second gate.

16. The semiconductor device of claim 12, wherein the first dummy gate and the second dummy gate cross a first fin of the semiconductor device, and the first gate and the second gate cross a second fin of the semiconductor device.

17. The semiconductor device of claim 12, further comprising:
    a second bridge, a third bridge and a fourth bridge formed between the first dummy gate and the second dummy gate and sequentially arranged in an order of the first bridge, the second bridge, the third bridge and the fourth bridge,
    wherein a first distance between the first bridge and the second bridge and a second distance between the third bridge and the fourth bridge are substantially equal to each other, and the first distance is smaller than a third distance between the second bridge and the third bridge.

18. The semiconductor device of claim 12, further comprising:
    a third dummy gate and a fourth dummy gate adjacent to the first dummy gate and the second dummy gate in the lengthwise direction,
    wherein the first to fourth dummy gates are sequentially arranged in an order of the first dummy gate, the second dummy gate, the third dummy gate and the fourth dummy gate.

19. A semiconductor device, comprising:
    a fin;
    a plurality of dummy gates adjacent to each other in a lengthwise direction, wherein the plurality of dummy gates cross the fin and each of the plurality of dummy gates has a width smaller than a minimum processing line width; and
    a plurality of bridge pairs formed between each of adjacent dummy gates from among the plurality of dummy gates,
    wherein the plurality of bridge pairs includes first to seventh bridge pairs, and the second to seventh bridge pairs are positioned at vertexes of a hexagonal honeycomb structure that is centered around the first bridge pair.

20. The semiconductor device of claim 19, wherein a distance between the first bridge pair and the second bridge pair and a distance between the first bridge pair and the third bridge pair are substantially equal to each other.

* * * * *